United States Patent
Xie et al.

(10) Patent No.: US 12,557,353 B2
(45) Date of Patent: Feb. 17, 2026

(54) METHOD AND STRUCTURE FOR A LOGIC DEVICE AND ANOTHER DEVICE

(71) Applicant: INTERNATIONAL BUSINESS MACHINES CORPORATION, Armonk, NY (US)

(72) Inventors: Ruilong Xie, Niskayuna, NY (US); Anthony I. Chou, Guilderland, NY (US); Brent A. Anderson, Jericho, VT (US); John Christopher Arnold, North Chatham, NY (US); Junli Wang, Slingerlands, NY (US); Kai Zhao, Albany, NY (US); Terence Hook, Jericho Center, VT (US); Julien Frougier, Albany, NY (US); Xuefeng Liu, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 565 days.

(21) Appl. No.: 17/663,676

(22) Filed: May 17, 2022

(65) Prior Publication Data

US 2023/0378258 A1    Nov. 23, 2023

(51) Int. Cl.
*H10D 62/10* (2025.01)
*H01L 21/02* (2006.01)
(Continued)

(52) U.S. Cl.
CPC ....... *H10D 62/118* (2025.01); *H01L 21/0237* (2013.01); *H01L 21/0259* (2013.01);
(Continued)

(58) Field of Classification Search
CPC ............. H01L 29/0665; H01L 21/0237; H01L 21/0259; H01L 21/743; H01L 21/76829;
(Continued)

(56) References Cited

U.S. PATENT DOCUMENTS 6,121,659 A  *  9/2000  Christensen ........ H01L 27/1203
                                                    257/353
8,159,060 B2     4/2012  Barth
(Continued)

FOREIGN PATENT DOCUMENTS

DE    112015006942 T5    6/2018
JP         6399887 B2   10/2018

OTHER PUBLICATIONS

Gupta et al., "Buried Power Rail Integration with Si FinFETs for CMOS Scaling beyond the 5 nm Node", 2020 Symposium on VLSI Technology Digest of Technical Papers-THL.6, @ 2020 IEEE, 2 pages.

(Continued)

*Primary Examiner* — Duy T Nguyen
*Assistant Examiner* — Pratiksha Jayant Lohakare
(74) *Attorney, Agent, or Firm* — Samuel A. Waldbaum

(57) ABSTRACT

A method including forming an oxide layer on a first substrate and forming a second substrate on the oxide layer. Doping a first section of the second substrate while not doping a second section of the second substrate. Forming a first nano device on the second section of the second substrate and forming a second nano device on first section of the second substrate. Flipping the first substrate over to allow for backside processing of the substrate and forming at least one backside contact connected to the first nano device while backside contacts are not formed or connected to the second nano device.

11 Claims, 16 Drawing Sheets

(51) Int. Cl.
*H01L 21/74* (2006.01)
*H01L 21/768* (2006.01)

(52) U.S. Cl.
CPC ...... *H01L 21/743* (2013.01); *H01L 21/76829* (2013.01); *H01L 21/76898* (2013.01)

(58) Field of Classification Search
CPC ........... H01L 21/76898; H01L 27/0296; H01L 27/0623; H01L 27/0629; H01L 27/1207; H01L 29/42392; H01L 29/78696; H01L 29/165; H01L 29/73; H01L 29/66545; H01L 29/775; H01L 23/481; H01L 27/0255; H01L 29/0673; H01L 29/66439; H01L 23/5286; B82Y 10/00
USPC .......................................................... 257/77
See application file for complete search history.

(56) References Cited

U.S. PATENT DOCUMENTS

| | | | |
|---|---|---|---|
| 8,853,799 B2 | 10/2014 | Alan | |
| 9,379,042 B2 | 6/2016 | Park | |
| 9,570,395 B1 | 2/2017 | Sengupta | |
| 10,586,765 B2 | 3/2020 | Smith | |
| 10,636,739 B2 | 4/2020 | Beyne | |
| 10,700,207 B2 | 6/2020 | Chen | |
| 10,734,224 B2 | 8/2020 | Smith | |
| 11,177,286 B2 | 11/2021 | Kim | |
| 2007/0296002 A1* | 12/2007 | Liang | H10D 86/201 257/288 |
| 2008/0054313 A1* | 3/2008 | Dyer | H01L 21/76898 257/E21.597 |
| 2014/0264733 A1 | 9/2014 | Yuan | |
| 2016/0276342 A1* | 9/2016 | Lim | H10D 84/853 |
| 2016/0336237 A1* | 11/2016 | Lee | H10D 84/038 |
| 2016/0363729 A1* | 12/2016 | Baiocco | G02B 6/1347 |
| 2018/0261593 A1* | 9/2018 | Cheng | H01L 27/0623 |
| 2020/0075574 A1 | 3/2020 | Smith | |
| 2020/0105671 A1 | 4/2020 | Lai | |
| 2020/0126845 A1* | 4/2020 | Lin | H10D 88/00 |
| 2020/0135634 A1* | 4/2020 | Chiang | H01L 29/4175 |
| 2020/0144264 A1* | 5/2020 | Li | H10D 84/038 |
| 2020/0294998 A1* | 9/2020 | Lilak | H01L 23/481 |
| 2021/0336020 A1* | 10/2021 | Yu | H10D 84/013 |
| 2021/0408287 A1* | 12/2021 | Hiblot | H10D 84/0193 |
| 2023/0132353 A1* | 4/2023 | Xie | H01L 23/535 257/288 |

OTHER PUBLICATIONS

Gupta et al., "Buried Power Rail Scaling and Metal Assessment for the 3 nm Node and Beyond", International Electron Devices Meeting, IEDM20-413, 2020 IEEE, pp. 20.3.1-20.3.4.

Mallik et al., "Economics of semiconductor scaling—a cost analysis for advanced technology node", 2019 Symposium on VLSI Technology Digest of Technical Papers, pp. T202-T203.

Mathur et al., "Buried Bitline fo sub-5nm SRAM Design", 2020 IEEE, IEDM20-409, pp. 20.2.1-20.2.4.

Moroz et al., "Can We Ever Get to a 100 nm Tall Library? Power Rail Design for 1nm Technology Node", @ 2020 EEE, 2 pages.

Prasad et a., "Buried Power Rails and Back-side Power Grids: Arm@ CPU Power Delivery Network Design Beyond 5nm", @ 2019 IEEE, pp. 19.1.1-19.1.4.

Chava et al., "Backside power delivery as a scaling knob for future systems", Proc. SPIE 10962, Design-Process-Technology Co-optimization for Manufacturability XIII, Mar. 20, 2019, 6 page, doi: https://doi.org/10.1117/12.2514942.

* cited by examiner

METHOD AND STRUCTURE FOR A LOGIC DEVICE AND ANOTHER DEVICE

BACKGROUND

The present invention generally relates to the field of microelectronic, and more particularly to formation of a logic device with a backside contact and forming another device over bulk substrate.

Nanosheet is the lead device architecture in continuing CMOS scaling. However, nanosheet technology has shown issues when scaling down such that as the devices become smaller and closer together, they are interfering with each other. Furthermore, as the devices become smaller and closer together forming the contacts can lead to spacing issues with adjacent components, which can lead to shorts.

BRIEF SUMMARY

Additional aspects and/or advantages will be set forth in part in the description which follows and, in part, will be apparent from the description, or may be learned by practice of the invention.

A microelectronic structure including a first device located on a dielectric layer and a second device located on a substrate layer, where the dielectric layer and the substrate level are substantially similar.

A microelectronic structure including a first nano device located on a dielectric layer. A backside contact located in the dielectric layer, where the backside contacts are connected to the first nano device. A second nano device located on substrate, where the substrate is in direct contact with the backside of the second nano device, where the first nano device and the second nano device are located on the same wafer.

A method including forming an oxide layer on a first substrate and forming a second substrate on the oxide layer. Doping a first section of the second substrate while not doping a second section of the second substrate. Forming a first nano device on the second section of the second substrate and forming a second nano device on first section of the second substrate. Flipping the first substrate over to allow for backside processing of the substrate and forming at least one backside contact connected to the first nano device while backside contacts are not formed or connected to the second nano device.

BRIEF DESCRIPTION OF THE DRAWINGS

The above and other aspects, features, and advantages of certain exemplary embodiments of the present invention will be more apparent from the following description taken in conjunction with the accompanying drawings, in which.

DETAILED DESCRIPTION

Figure 1:
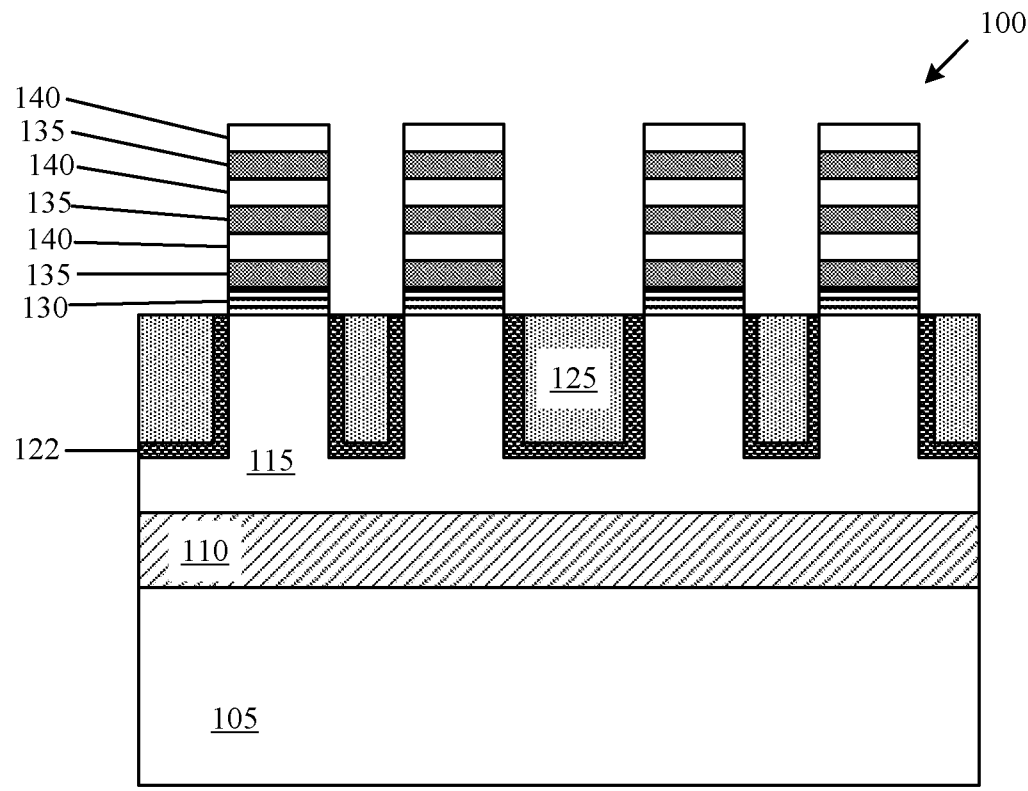
FIG. 1 illustrates a cross section of a first nano device after the patterning of a nano stack, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. When forming a backside contacts or backside power rails in, for example, a logic device, typically the bulk substrate is removed to allow for the formation of these components. However, some devices utilize the bulk substrate as part of the device, for example, bipolar junction transistor (BJT) or electronic static discharge diode (ESD diode). When the bulk substrate is removed to allow for the backside processing of the logic device, this would prevent other devices that utilize the bulk substrate as a component from functioning properly. The present invention is directed towards a method and structure that allows for the removal of the bulk substrate for a first device, for example, a logic circuit, but having the bulk substrate remaining for a second device, for example, an ESD diode or a BJT.

FIG. 1 illustrates a cross section of a first nano device 100 after the patterning of a nano stack, in accordance with the embodiment of the present invention. The first nano device 100 includes a substrate 105, a buried oxide layer 110, a second substrate 115, and a nano stack. The first nano device 100 is the device where the substrate 105 and the second substrate 115 (i.e., the bulk substrate) will be removed to allow for the formation of backside components. The second nano device 101 and the third nano device 102 are examples of additional devices that can be formed on the same substrate as the first nano device 100. The second nano device 101 device 102 and the third nano device 102 utilize the second substrate 115 as part of the device.

The substrate 105 and the second substrate 115 can be, for example, a material including, but not necessarily limited to, silicon (Si), silicon germanium (SiGe), Si:C (carbon doped silicon), carbon doped silicon germanium (SiGe:C), III-V, II-V compound semiconductor or another like semiconductor. In addition, multiple layers of the semiconductor materials can be used as the semiconductor material of the substrate 105 and the second substrate 115. In some embodiments, the substrate 105 and the second substrate 115 includes both semiconductor materials and dielectric materials. The semiconductor substrate 105 and the second substrate 115 may also comprise an organic semiconductor or a layered semiconductor such as, for example, Si/SiGe, a silicon-on-insulator or a SiGe-on-insulator. A portion or the entire semiconductor substrate 105 and the second substrate 115 may also be comprised of an amorphous, polycrystalline, or monocrystalline. The semiconductor substrate 105 and the second substrate 115 may be doped, undoped or contain doped regions and undoped regions therein.

The nano stack is patterned to form a plurality of nano stack columns where the patterning forms trenches in the second substrate 115. The trenches are lined with a liner 122 and filled with a shallow trench isolation layer 125. The liner 122 can be comprised of, for example, SiN, and the shallow trench isolation layer 125 can be comprised of, for example, an oxide.

The nano stack is comprised of multiple layers. The nano stack includes a first sacrificial layer 130, a plurality of second sacrificial layers 135, and a plurality of nanosheets 140. The number of layers illustrated are for example purposes only. The first sacrificial layer 130 can be comprised of, for example, SiGe, where Ge is in the range of about 45% to 70%. A second group of sacrificial layers includes the plurality of second sacrificial layers 135. Each layer of the second group of sacrificial layers 135 can be comprised of, for example, SiGe, where Ge is in the range of about 15% to 35%. The plurality of nanosheets 140 comprised of, for example, Si. The plurality of nanosheets 140 and the plurality of second sacrificial layers 135 are formed in an alternating arrangement.

Figure 2:
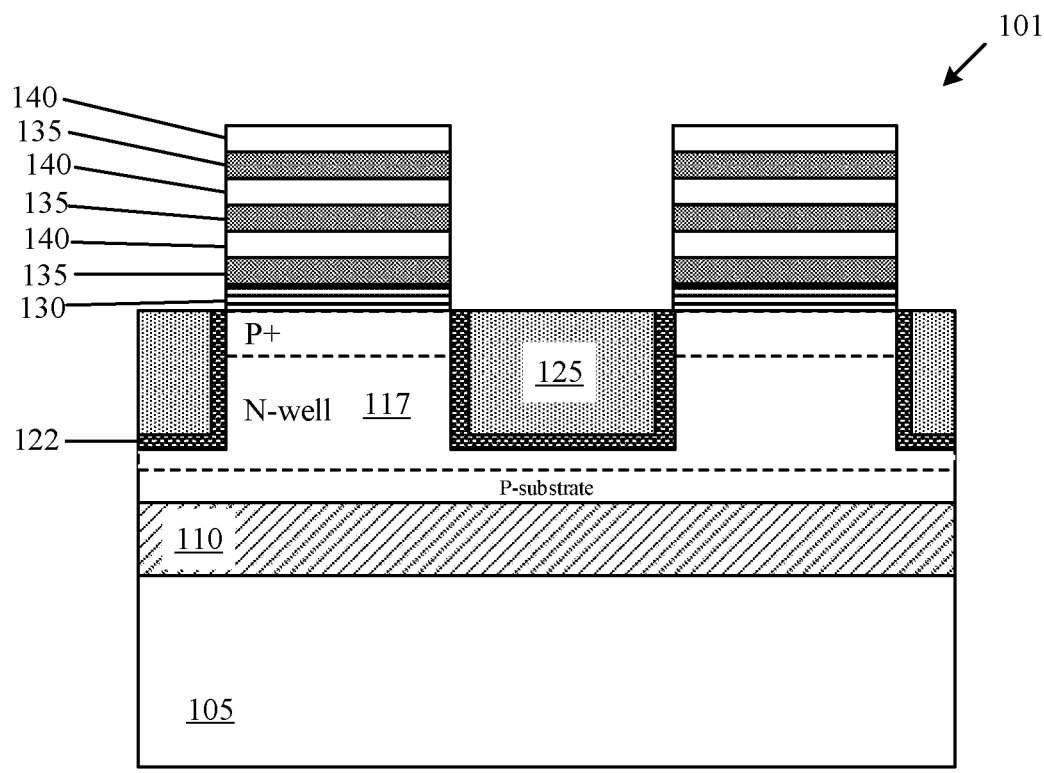
FIG. 2 illustrates a cross section of a second nano device after the patterning of a nano stack, in accordance with the embodiment of the present invention.

FIG. 2 illustrates a cross section of a second nano device 101 after the patterning of a nano stack, in accordance with the embodiment of the present invention. The second nano device 101 can be for example, an electronic static discharge diode (ESD diode). The second nano device 101 being a ESD diode as illustrated by the figures is meant to only as an example of a secondary device that can be formed simultaneously with the first nano device 101, where the secondary device utilizes the bulk substrate as a component for the secondary device. The second nano device 101 can be formed with the first nano device on the same substrate 105. The second nano device 101 includes the substrate 105, the buried oxide layer 110, a doped substrate 117, and a nano stack. Trenches ae formed in the doped substrate 117 during the patterning of the nano stack. The nano stack includes a first sacrificial layer 130 and alternating layers of the second sacrificial layer 135 and the nanosheets 140. The trenches are lined with a liner 122 and filled with a shallow trench isolation layer 125.

Figure 3:
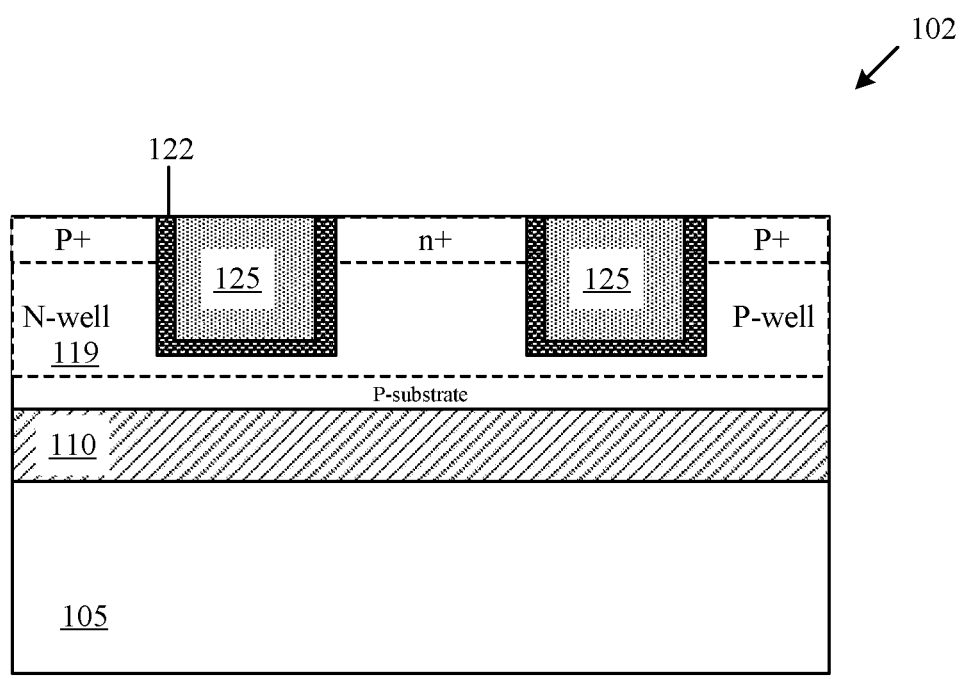
FIG. 3 illustrates a cross section of a third nano device after formation of the shallow trench isolation layer, in accordance with the embodiment of the present invention.

FIG. 3 illustrates a cross section of a third nano device 102 after formation of the shallow trench isolation layer 125, in accordance with the embodiment of the present invention. The third nano device 103 can be for example, a bipolar junction transistor (BJT). The third nano device 102 being a BJT as illustrated by the figures is meant to only as an example of a secondary device that can be formed simultaneously with the first nano device 101, where the secondary device utilizes the bulk substrate as a component for the secondary device. The third nano device includes substrate 105, the buried oxide layer 110, a second doped substrate 119. Trenches are formed in the second doped substrate 119 when the nano stack of the first device 100 are patterned. The trenches are lined with a liner 122 and filled with a shallow trench isolation layer 125.

Figure 4:
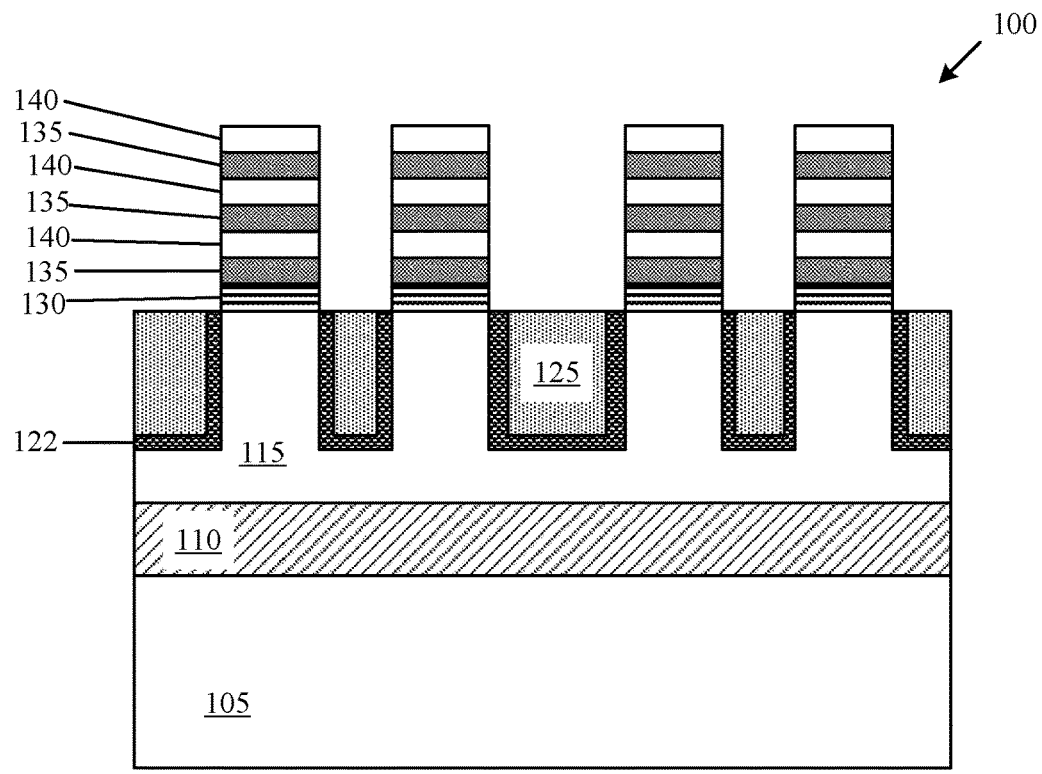
FIG. 4 illustrates a cross section of a first nano device after formation and patterning of a dummy gate, in accordance with the embodiment of the present invention.
Figure 5:
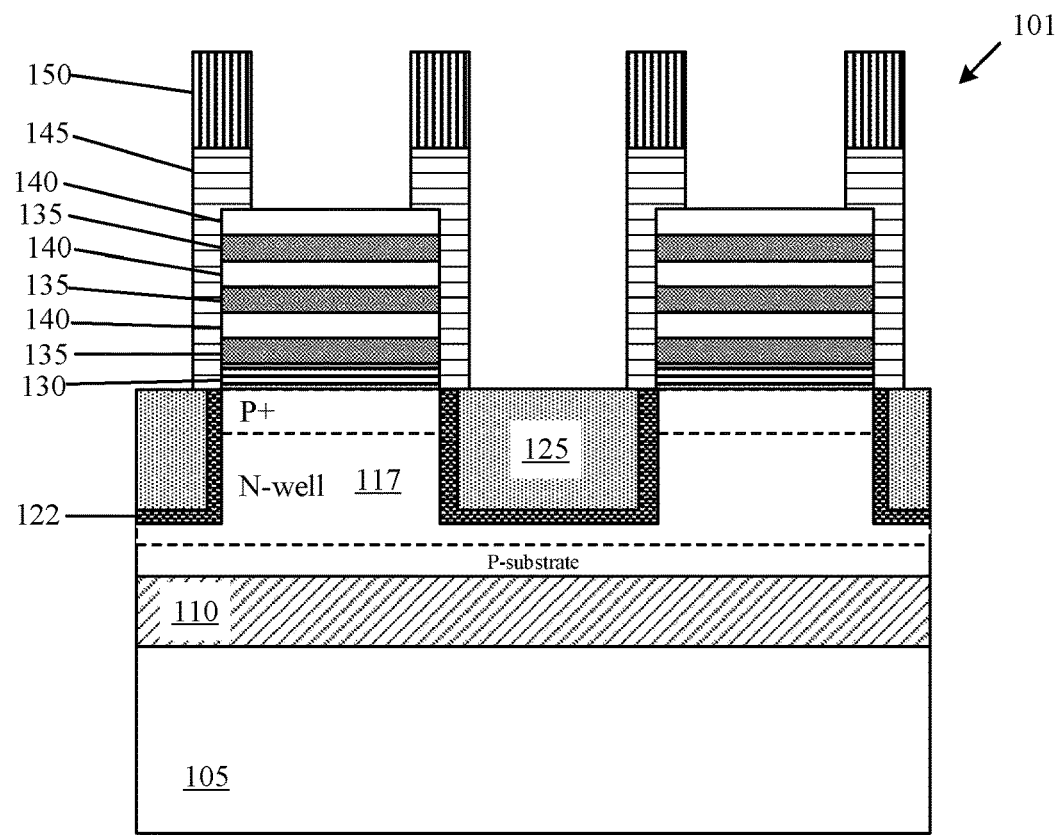
FIG. 5 illustrates a cross section of a second nano device after formation and patterning of a dummy gate, in accordance with the embodiment of the present invention.

FIG. 4 illustrates a cross section of a first nano device 100 after formation and patterning of a dummy gate 145, in accordance with the embodiment of the present invention. FIG. 5 illustrates a cross section of a second nano device 101 after formation and patterning of a dummy gate 145, in accordance with the embodiment of the present invention. A dummy gate 145 is formed on the exposed surfaces and a hardmask 150 is formed on top of the dummy gate 145. The dummy gate 145 and the hardmask 150 are patterned into a plurality of columns. FIG. 5 illustrates that the columns comprised of the dummy gate 145 and hardmask 150 are located at the ends of the nano stacks. The dummy gates for the first nano device 100 is not shown in FIG. 4, because FIG. 4 shows the cross-section in the source/drain regions of first nano device 100.

Figure 6:
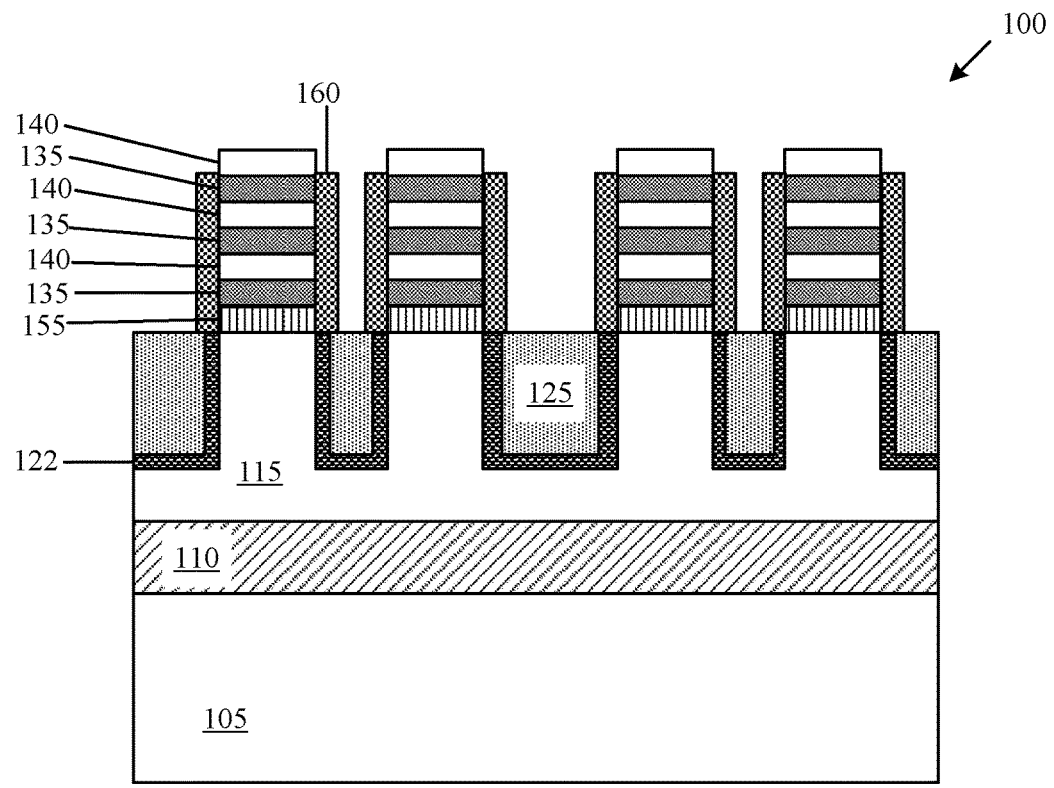
FIG. 6 illustrates a cross section of a first nano device after replacing the first sacrificial layer with a bottom dielectric layer and formation of an upper spacer, in accordance with the embodiment of the present invention.
Figure 7:
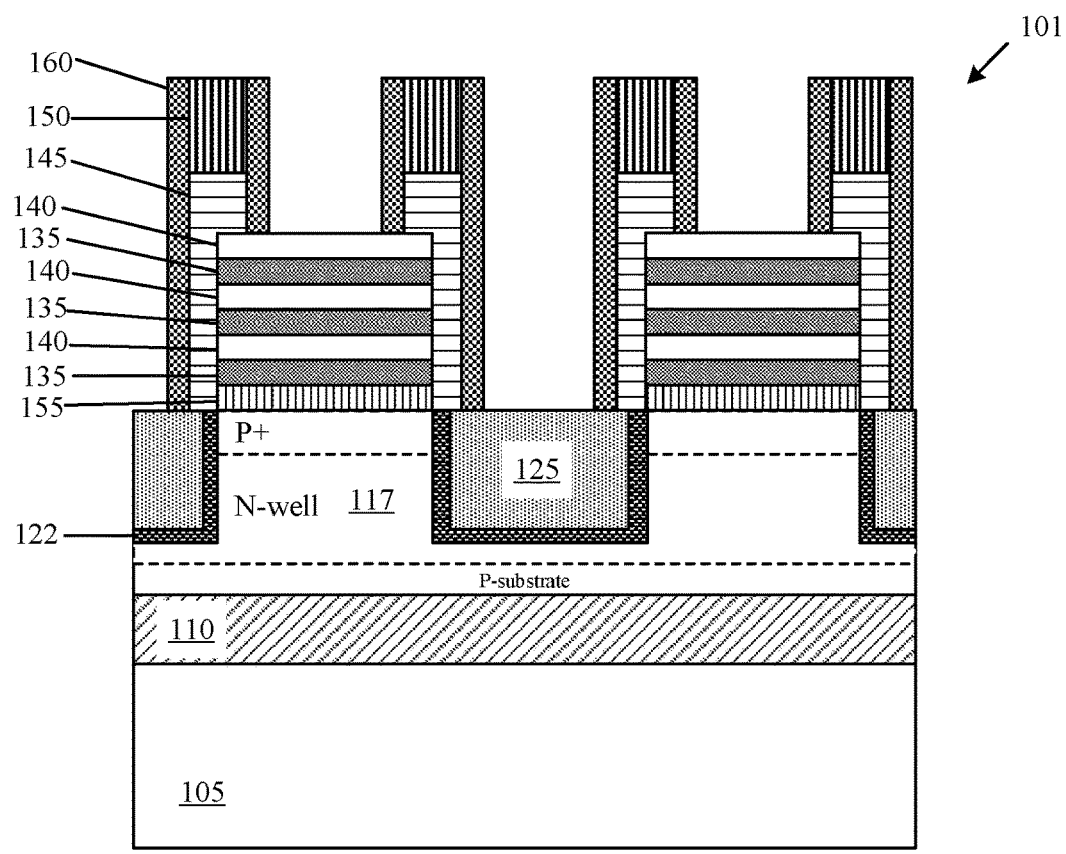
FIG. 7 illustrates a cross section of a second nano device after replacing the first sacrificial layer with a bottom dielectric layer and formation of an upper spacer, in accordance with the embodiment of the present invention.

FIG. 6 illustrates a cross section of a first nano device 100 after replacing the first sacrificial layer 130 with a bottom dielectric layer 155 and formation of an upper spacer 160, in accordance with the embodiment of the present invention. FIG. 7 illustrates a cross section of a second nano device 101 after replacing the first sacrificial layer 130 with a bottom dielectric layer 155 and formation of an upper spacer 160, in accordance with the embodiment of the present invention. The first sacrificial layer 130 is selectively removed and replaced with a bottom dielectric layer 155. An upper spacer 160 is formed on the exposed surfaces and etch back so that the upper spacer 160 is located along the sidewalls of the nano stack, as illustrated by FIG. 6, and along the sidewalls of the dummy gate 145 and the hardmask 150, as illustrated by FIG. 7.

Figure 8:
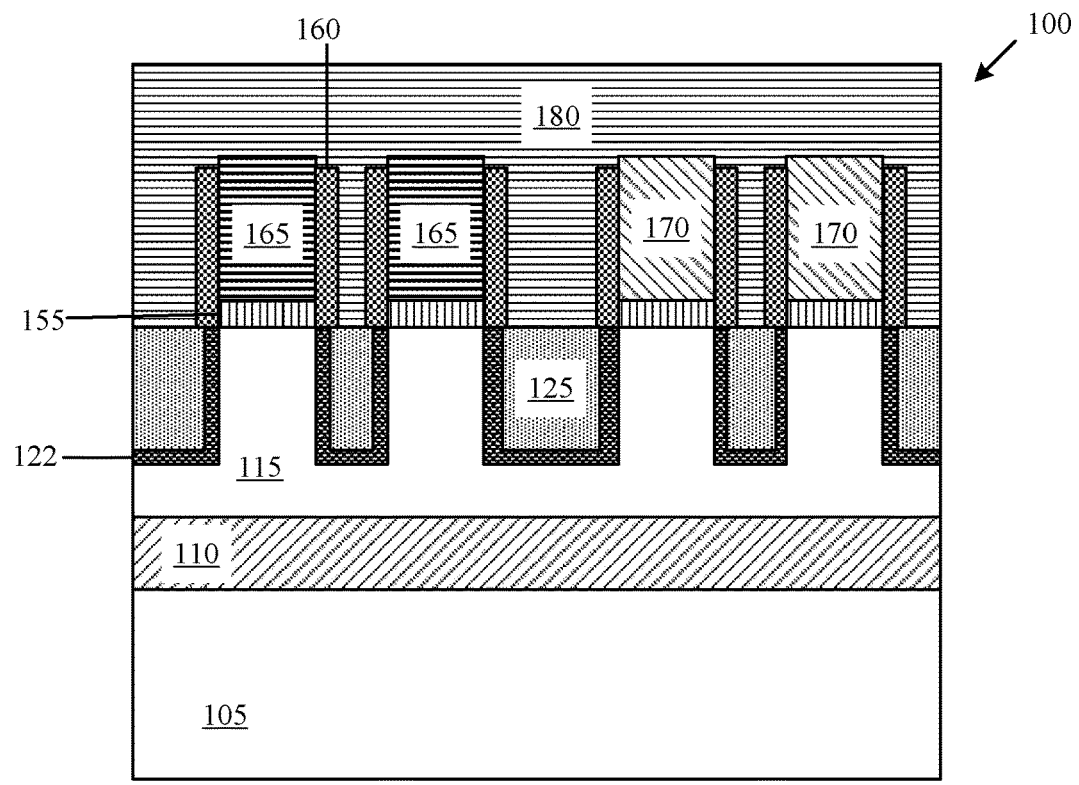
FIG. 8 illustrates a cross section of a first nano device after formation of the source/drain and formation of an interlayer dielectric layer, in accordance with the embodiment of the present invention.
Figure 9:
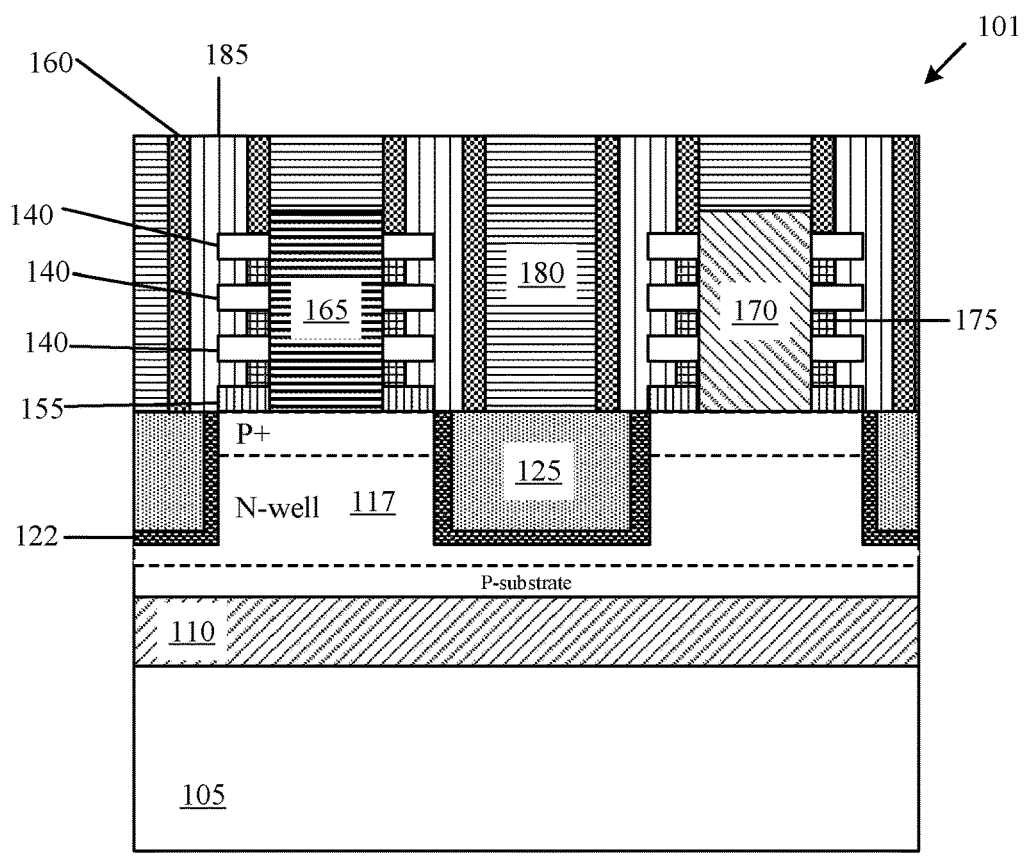
FIG. 9 illustrates a cross section of a second nano device after formation of the source/drain and formation of an interlayer dielectric layer and a gate, in accordance with the embodiment of the present invention.
Figure 10:
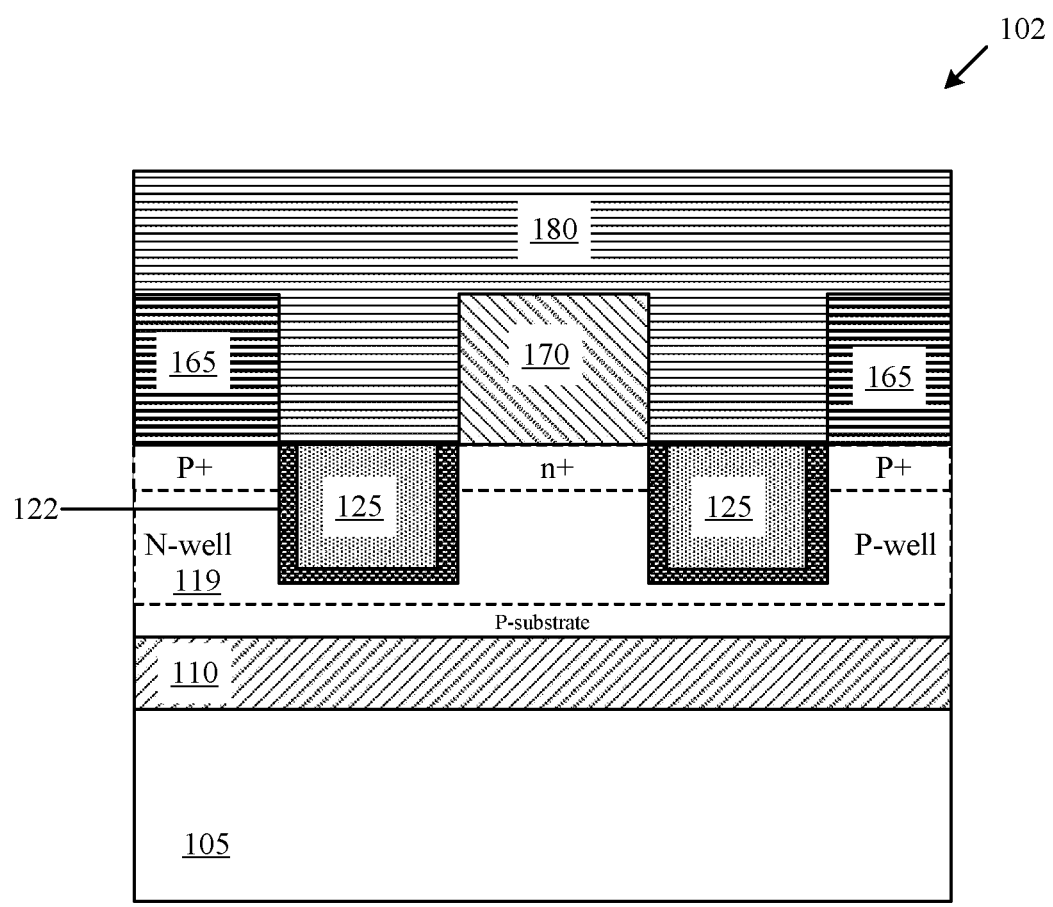
FIG. 10 illustrates a cross section of a third nano device after formation of the source/drain and formation of an interlayer dielectric layer, in accordance with the embodiment of the present invention.

FIGS. 8, 9 and 10 illustrate the process stage after formation of inner spacer, source/drain epi, interlayer dielectric, dummy gate/sacrificial SiGe removal and replacement gate formation for the nano devices. FIG. 8 illustrates a cross section of a first nano device 100 after formation of the inner spacer (not shown), source/drain 165 and 170, and formation of an interlayer dielectric layer 180, and dummy gate/sacrificial SiGe removal and replacement gate formation (not shown) for the nano devices, in accordance with the embodiment of the present invention. The nanosheets 140 and the second sacrificial layers 135 are recessed and an inner spacer (not shown) is formed. A source/drain 165, 170 are formed where the nano stack was recessed. The source/drain 165, 170 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques. An interlayer dielectric layer 180 is formed on the exposed surfaces of the shallow trench isolation layer 125, the upper spacer 160 and the source/drain 165, 170.

FIG. 9 illustrates a cross section of a second nano device 101 after formation of the inner spacer 175, the source/drain 165, 170 and formation of an interlayer dielectric layer 180 and dummy gate/sacrificial SiGe removal and replacement gate 185 formation for the nano devices, in accordance with the embodiment of the present invention. The second sacrificial layer 135 are recessed and an inner spacer 175 is formed in the recessed space. After interlayer dielectric layer 180 is trimmed by, for example, chemical mechanical processing (CMP), the dummy gate 145 and sacrificial layer 135 is removed and replaced with a gate 185. The gate 185 can be comprised of, for example, a gate dielectric liner, such as high-k dielectric like $HfO_2$, $ZrO_2$, $HfL_aO_x$, etc., and work function layers, such as TiN, TiAlC, TiC, etc., and conductive metal fills, like W. A source/drain 165, 170 is formed adjacent to the inner spacers 175, the nanosheets 140, and the upper spacer 160. An interlayer dielectric layer 180 is formed on the exposed surfaces of the source/drain 165, 170 and the shallow trench isolation layer 125.

FIG. 10 illustrates a cross section of a third nano device 102 after formation of the source/drain 165, 170 and formation of an interlayer dielectric layer 180, in accordance with the embodiment of the present invention. A source/drain 165, 170 is formed on top of the doped sections of the second doped substrate 119. An interlayer dielectric layer 180 is formed on top of the sources/drain 165, 170, on top of the liner 122, and on top of the shallow trench isolation layer 125.

Figure 11:
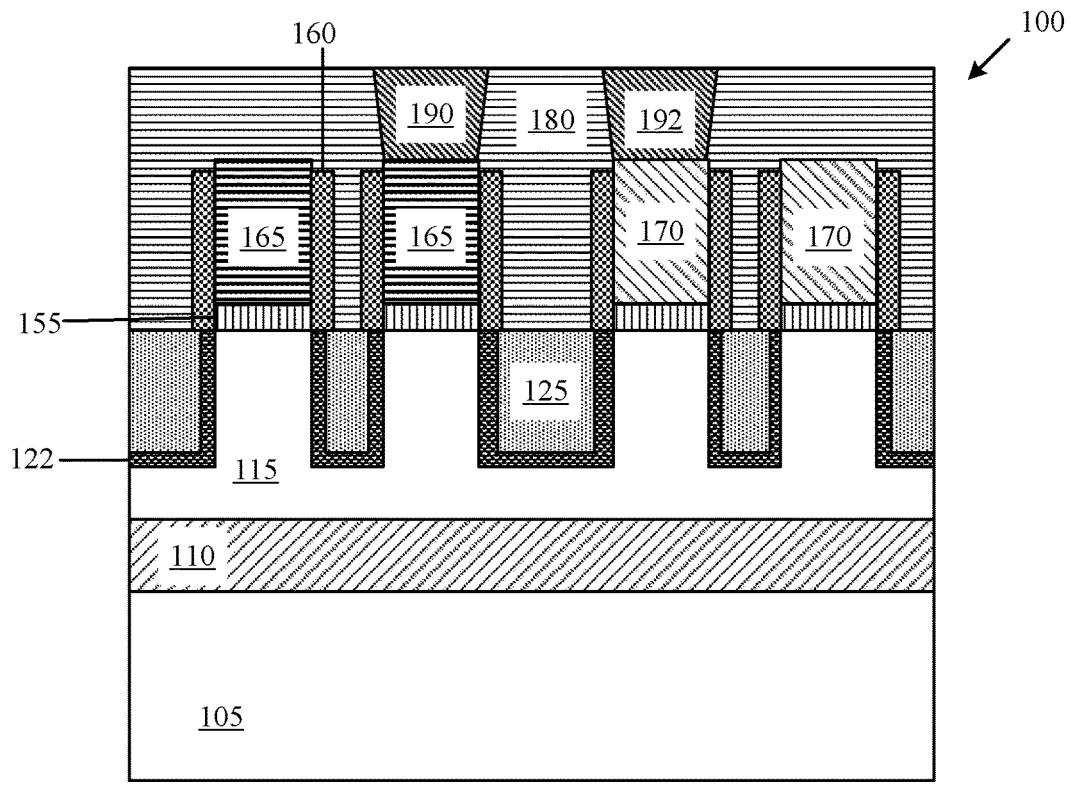
FIG. 11 illustrates a cross section of a first nano device after formation of a first set of contacts, in accordance with the embodiment of the present invention.
Figure 12:
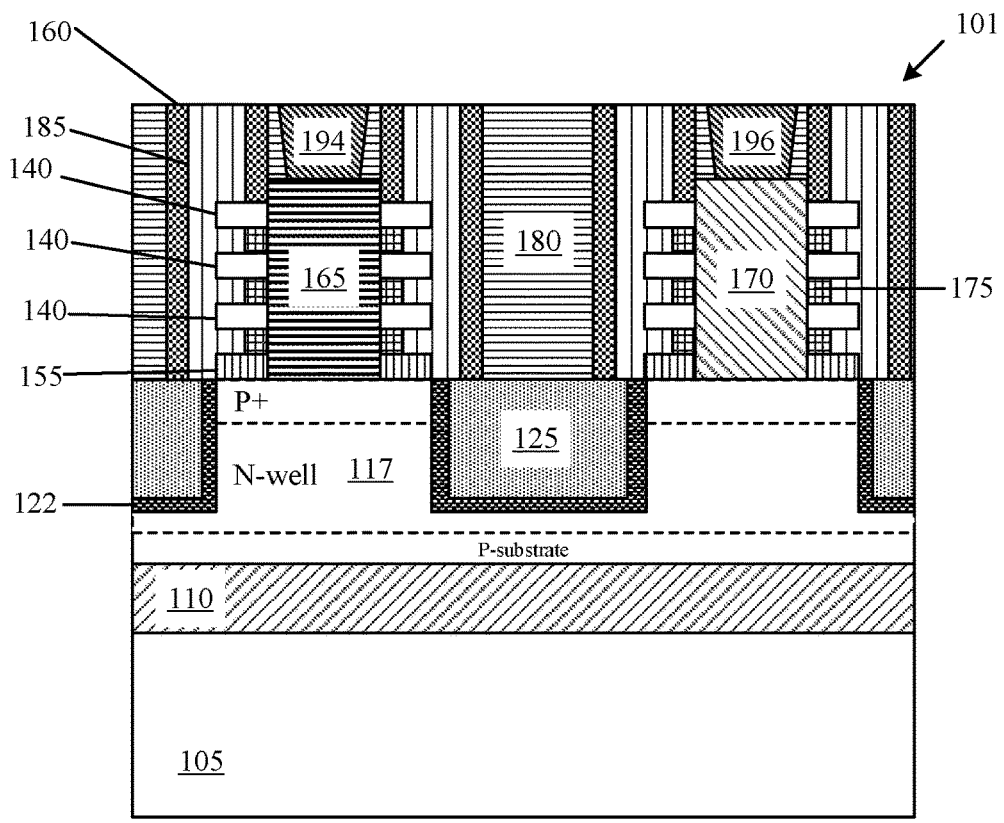
FIG. 12 illustrates a cross section of a second nano device after formation of a second set of contacts, in accordance with the embodiment of the present invention.
Figure 13:
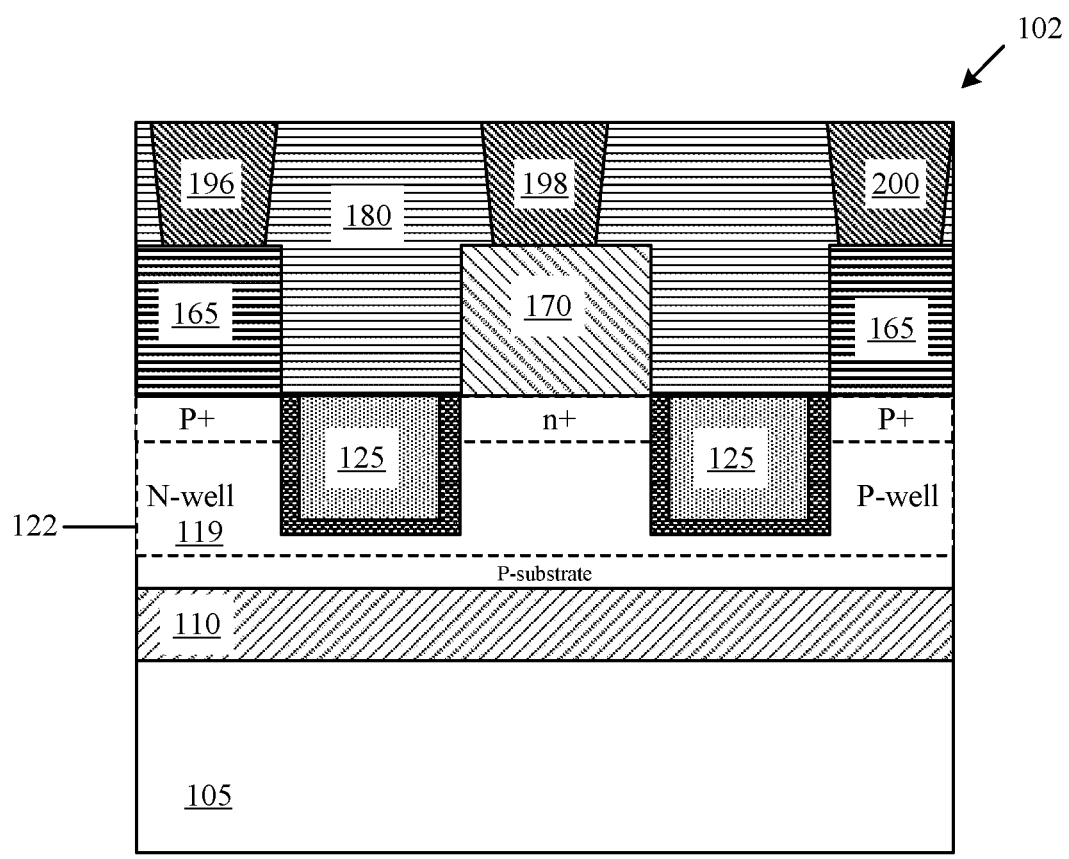
FIG. 13 illustrates a cross section of a third nano device after formation of a third set of contacts, in accordance with the embodiment of the present invention.

FIGS. 11, 12, and 13 illustrate the process stage after middle-of-line contacts patterning and metallization. FIG. 11 illustrates a cross section of a first nano device after formation of a first set of contacts 190, 192, in accordance with the embodiment of the present invention. A first set of contacts 190, 192 are formed in the interlayer dielectric layer 180. One contact 190 is connected to top of one of the source/drain 165 and one contact 192 is connected to the top of another source/drain 170.

FIG. 12 illustrates a cross section of a second nano device after formation of a second set of contacts 194, 196, in accordance with the embodiment of the present invention. A second set of contacts 194, 196 are formed in the interlayer dielectric layer 180. One contact 194 is connected to top of one of the source/drain 165 and one contact 196 is connected to the top of another source/drain 170.

FIG. 13 illustrates a cross section of a third nano device after formation of a third set of contacts, in accordance with the embodiment of the present invention. A third set of contacts 196, 198, 200 are formed in the interlayer dielectric layer 180. One contact 196 is connected to top of one of the source/drain 165, another contact 198 is connected to the top of one of the source/drain 170, and one contact 200 is connected to the top of another source/drain 165. The frontside contacts are the contacts connected to the device during the frontside processing of the device. For example, the frontside contacts include the first set of contacts 190, 192, the second set of contacts 194, 196, and the third set of contacts 196, 198, 200.

Figure 14:
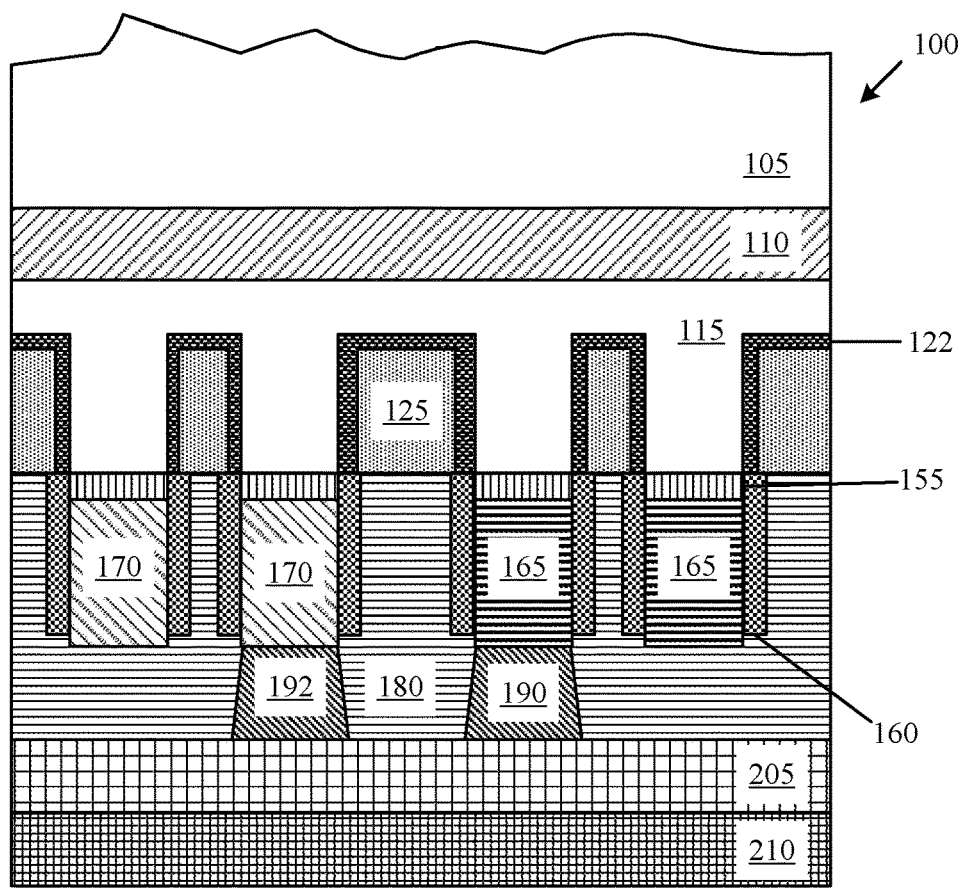
FIG. 14 illustrates a cross section of a first nano device after attaching of a carrier wafer and flipping the first nano device over to process the backside of the first nano device, in accordance with the embodiment of the present invention.
Figure 15:
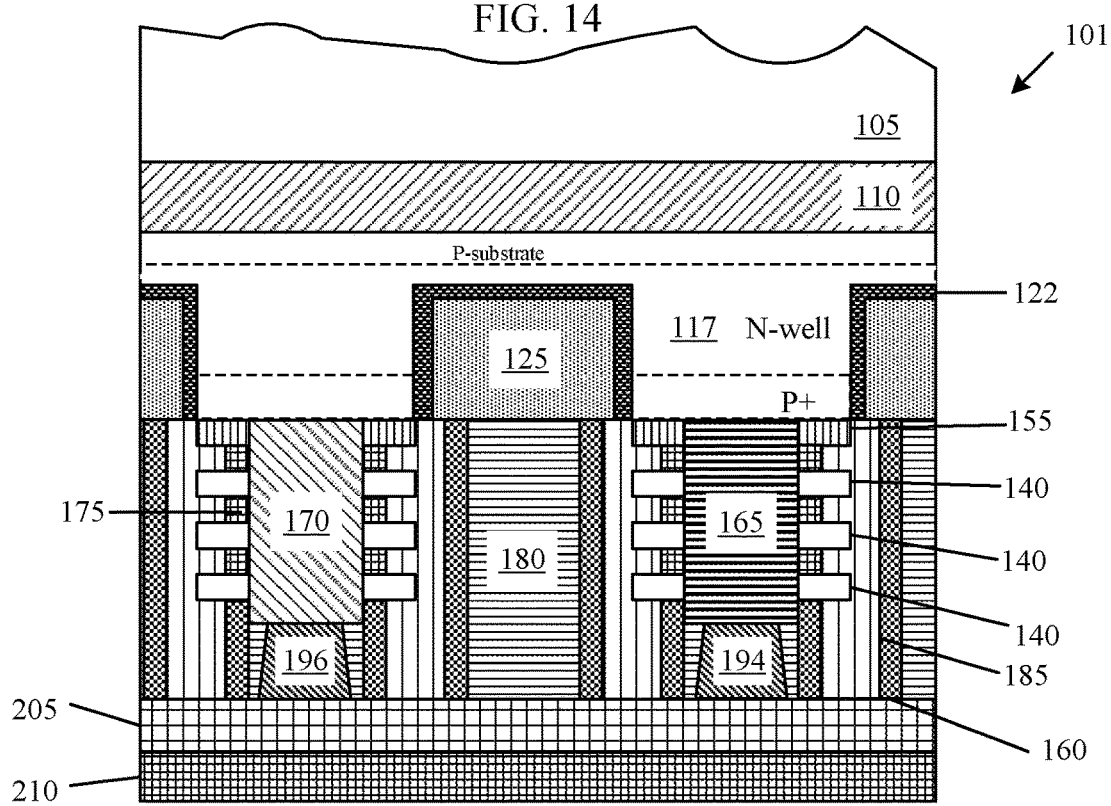
FIG. 15 illustrates a cross section of a second nano device after attaching of a carrier wafer and flipping the second nano device over to process the backside of the second nano device, in accordance with the embodiment of the present invention.
Figure 16:
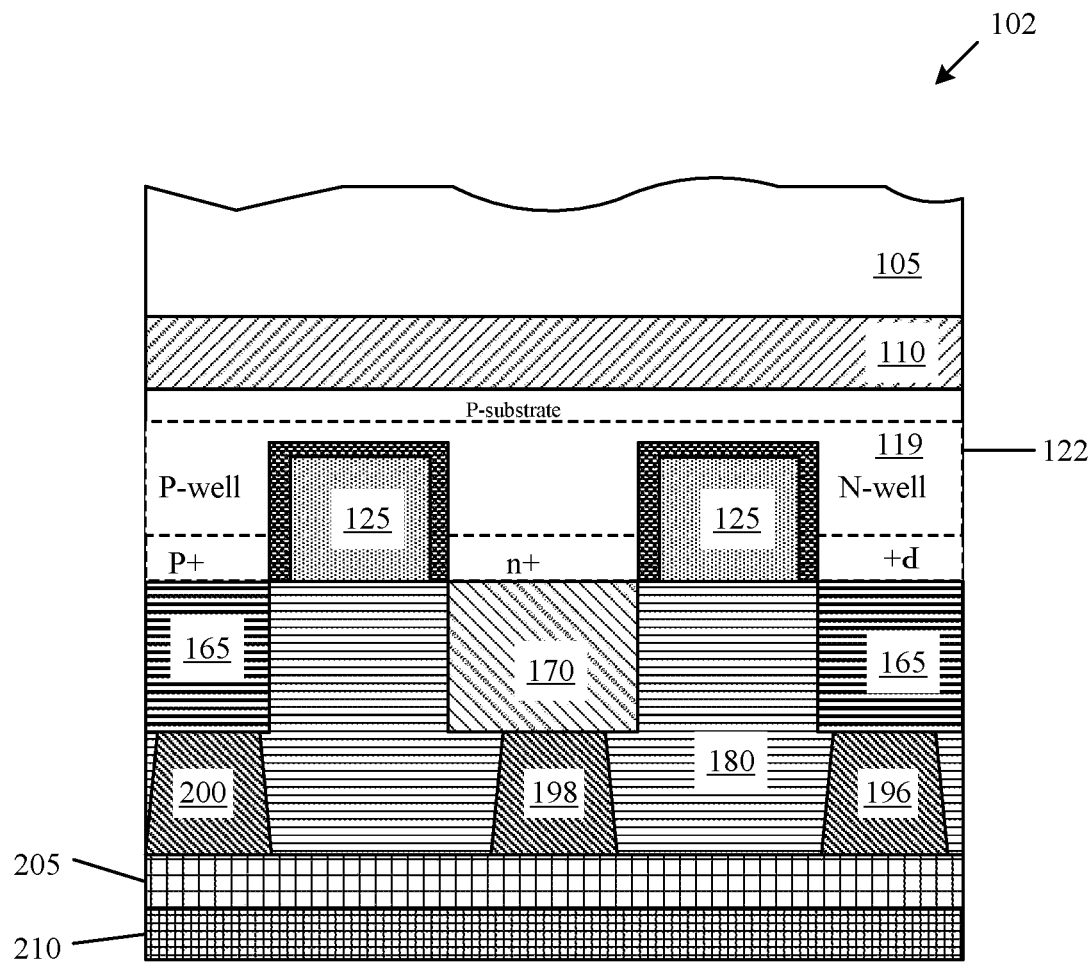
FIG. 16 illustrates a cross section of a third nano device after attaching of a carrier wafer and flipping the third nano device over to process the backside of the third nano device, in accordance with the embodiment of the present invention.

FIGS. 14, 15 and 16 illustrate the process stage after BEOL interconnect formation, carrier wafer bonding, wafer flip, and bulk Si substrate thinning. FIG. 14 illustrates a cross section of a first nano device 100 after attaching of a carrier wafer and flipping the first nano device over to process the backside of the first nano device, in accordance with the embodiment of the present invention. A back end of the line (BEOL) layer 205 is formed on the top surfaces of the interlayer dielectric layer 180 and on the top surface of the first set of contacts 190, 192. A carrier wafer 210 is attached to the BEOL layer 205. FIGS. 1, 4, 6, 8, and 11 illustrate the frontside processing of the first nano device 100. FIG. 14 illustrates that the first nano device 100 is flipped over to allow for the backside processing of the first nano device 100. The substrate 105 is thinned down by, for example, a substrate grinding process causing the substrate to be unevenly removed.

FIG. 15 illustrates a cross section of a second nano device after attaching of a carrier wafer 210 and flipping the second nano device 101 over to process the backside of the second nano device 101, in accordance with the embodiment of the present invention. A back end of the line (BEOL) layer 205 is formed on the top surfaces of the interlayer dielectric layer 180, on the top surface of the second set of contacts 194, 196, on top of the gate 185, and on top of the upper spacer 160. A carrier wafer 210 is attached to the BEOL layer 205. FIGS. 2, 5, 7, 9, and 122 illustrate the frontside processing of the second nano device 101. FIG. 15 illustrates that the second nano device 101 is flipped over to allow for the backside processing of the second nano device 101. The substrate 105 is thinned down by, for example, a substrate grinding process causing the substrate to be unevenly removed.

FIG. 16 illustrates a cross section of a third nano device after attaching of a carrier wafer 210 and flipping the third nano device 102 over to process the backside of the third nano device 102, in accordance with the embodiment of the present invention. A back end of the line (BEOL) layer 205 is formed on the top surfaces of the interlayer dielectric layer 180 and on the top surface of the third set of contacts 196, 198, 200. A carrier wafer 210 is attached to the BEOL layer 205. FIGS. 3, 10 and 13 illustrate the frontside processing of the third nano device 102. FIG. 16 illustrates that the third nano device 102 is flipped over to allow for the backside processing of the third nano device 102. The substrate 105 is thinned down by, for example, a substrate grinding process causing the substrate to be unevenly removed.

Figure 17:
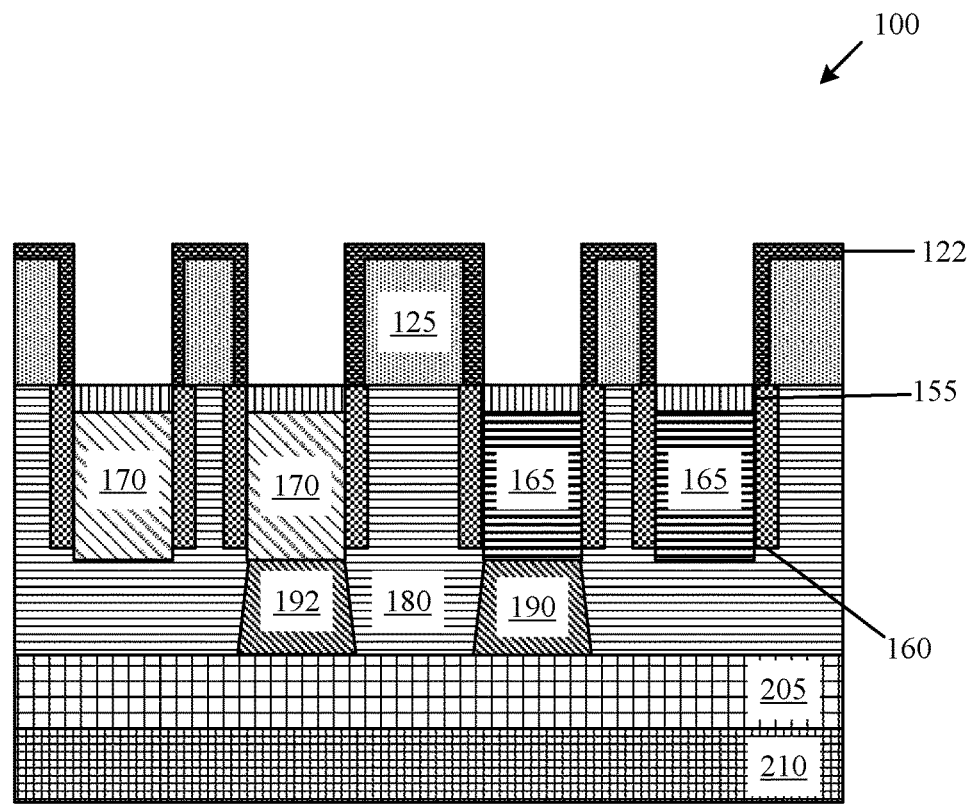
FIG. 17 illustrates a cross section of a first nano device after removal of the substrate, the buried oxide layer, and the second substrate, in accordance with the embodiment of the present invention.
Figure 18:
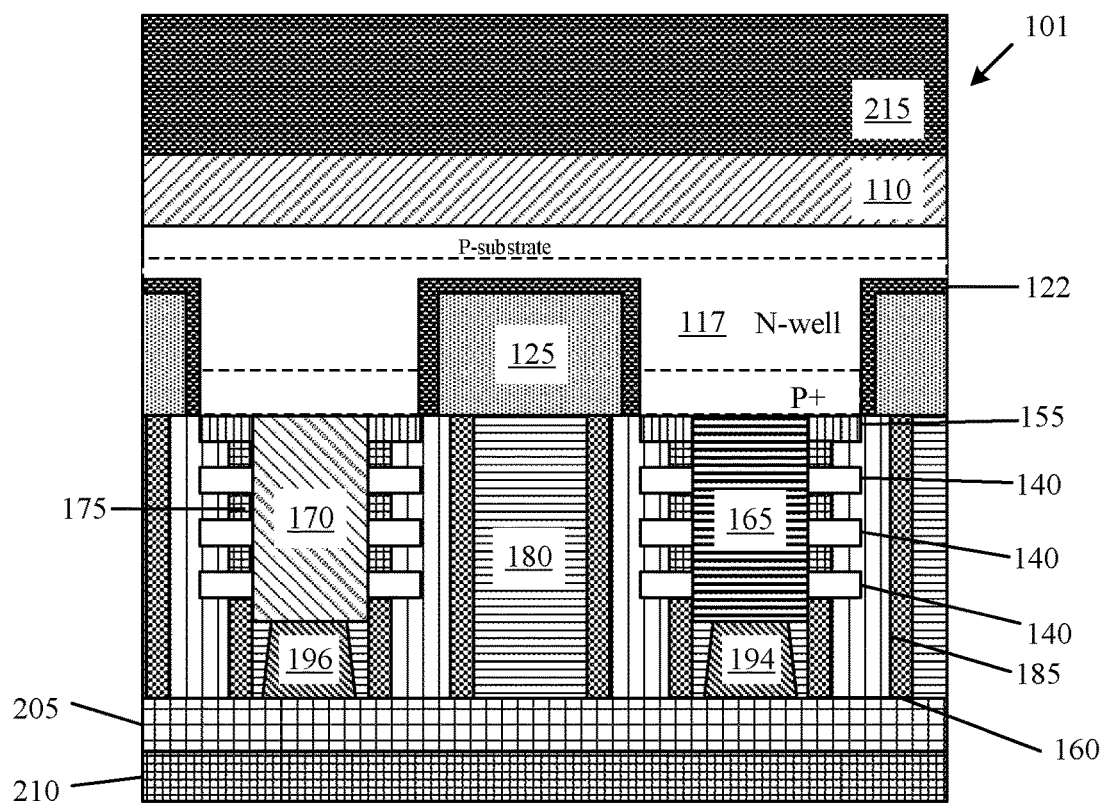
FIG. 18 illustrates a cross section of a second nano device after removal of the substrate and the formation of a lithography layer, in accordance with the embodiment of the present invention.
Figure 19:
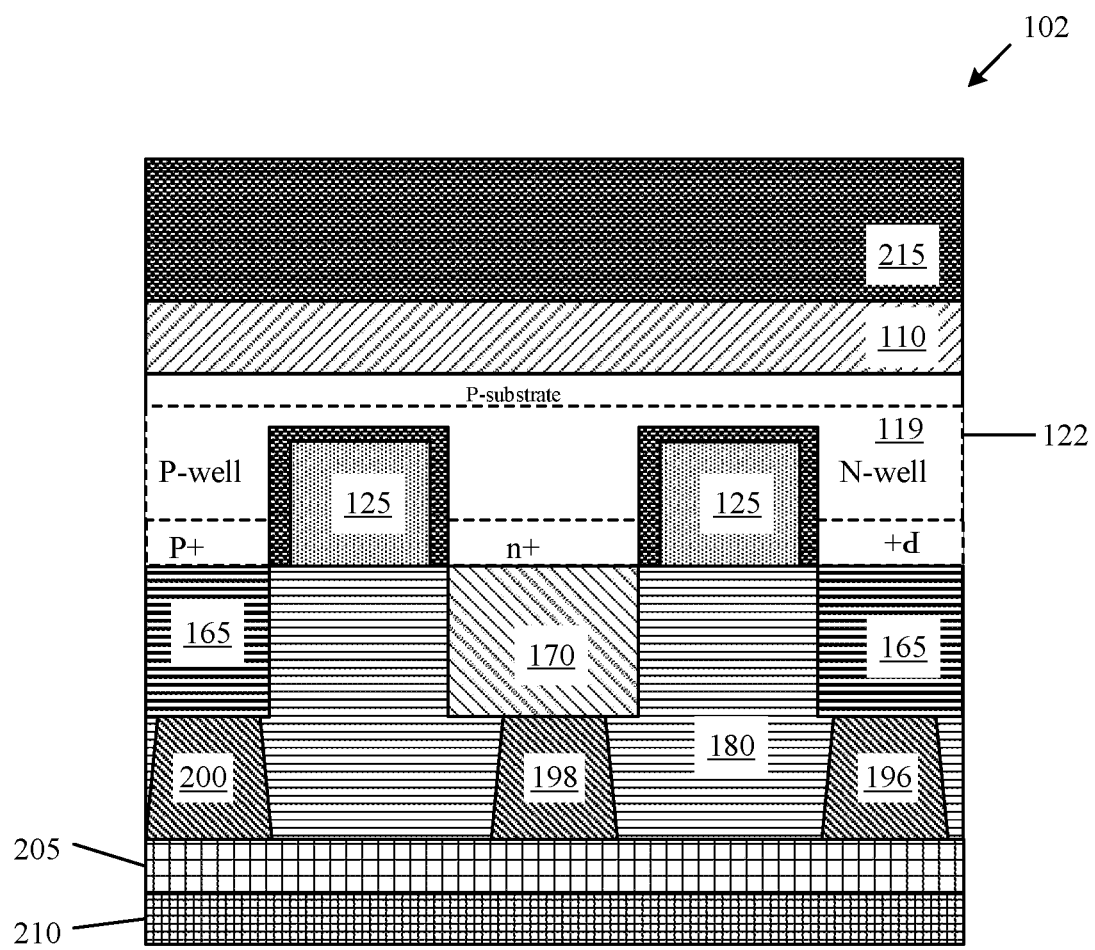
FIG. 19 illustrates a cross section of a third nano device after removal of the substrate and the formation of a lithography layer, in accordance with the embodiment of the present invention.

FIGS. 17, 18 and 19 illustrate the process stage after the substrate 105 is completely removed, stopping on BOX layer 110, followed by BOX layer 110 and second substrate 115 removal in first device region while being protected and reserved in a second and third device regions. FIG. 17 illustrates a cross section of a first nano device 100 after removal of the substrate 105, the buried oxide layer 110, and the second substrate 115, in accordance with the embodiment of the present invention. The substrate 105 is removed to expose the buried oxide layer 110. A lithography layer 215 is formed on top of the buried oxide layer 110 on the other device (i.e., the second nano device 101 or the third nano device 102) and the lithography layer 215 is removed where the first nano device 100 is located. The buried oxide layer 110 is removed. The second substrate 115 is selectively removed to expose the liner 122 and a surface of the bottom dielectric layer 155.

FIG. 18 illustrates a cross section of a second nano device 101 after removal of the substrate 105 and the formation of a lithography layer, in accordance with the embodiment of the present invention. The substrate 105 is removed to expose the buried oxide layer 110. A lithography layer 215 is formed on top of the buried oxide layer 110. The lithography layer 215 protects the buried oxide layer 110 located in the second nano device 101 while the first nano device 100 is processed. The lithography layer 215 and the buried oxide layer 110 protects the doped substrate 117 from being removed/damaged while the second substrate 115 is removed from the backside of the first nano device 100.

FIG. 19 illustrates a cross section of a third nano device 102 after removal of the substrate and the formation of a lithography layer 215, in accordance with the embodiment of the present invention. The substrate 105 is removed to expose the buried oxide layer 110. A lithography layer 215 is formed on top of the buried oxide layer 110. The lithography layer 215 protects the buried oxide layer 110 located in the third nano device 102 while the first nano device 100 is processed. The lithography layer 215 and the buried oxide layer 110 protects the second doped substrate 119 from being removed/damaged while the second substrate 115 is removed from the backside of the first nano device 100.

Figure 20:
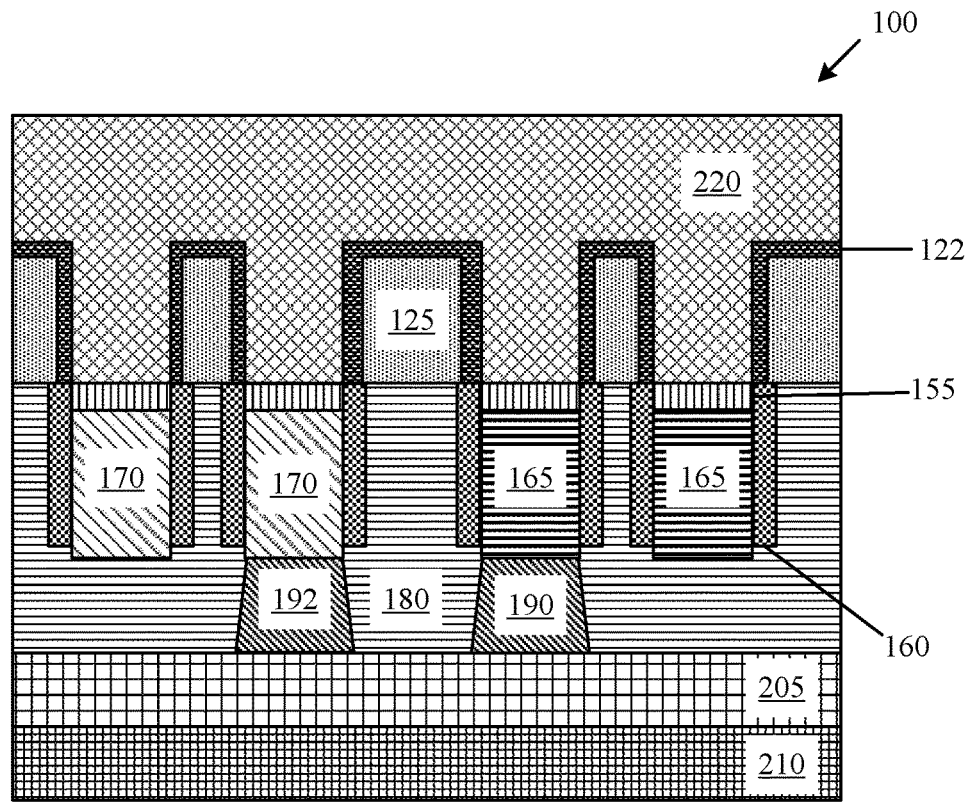
FIG. 20 illustrates a cross section of a first nano device after formation of a second interlayer dielectric, in accordance with the embodiment of the present invention.
Figure 21:
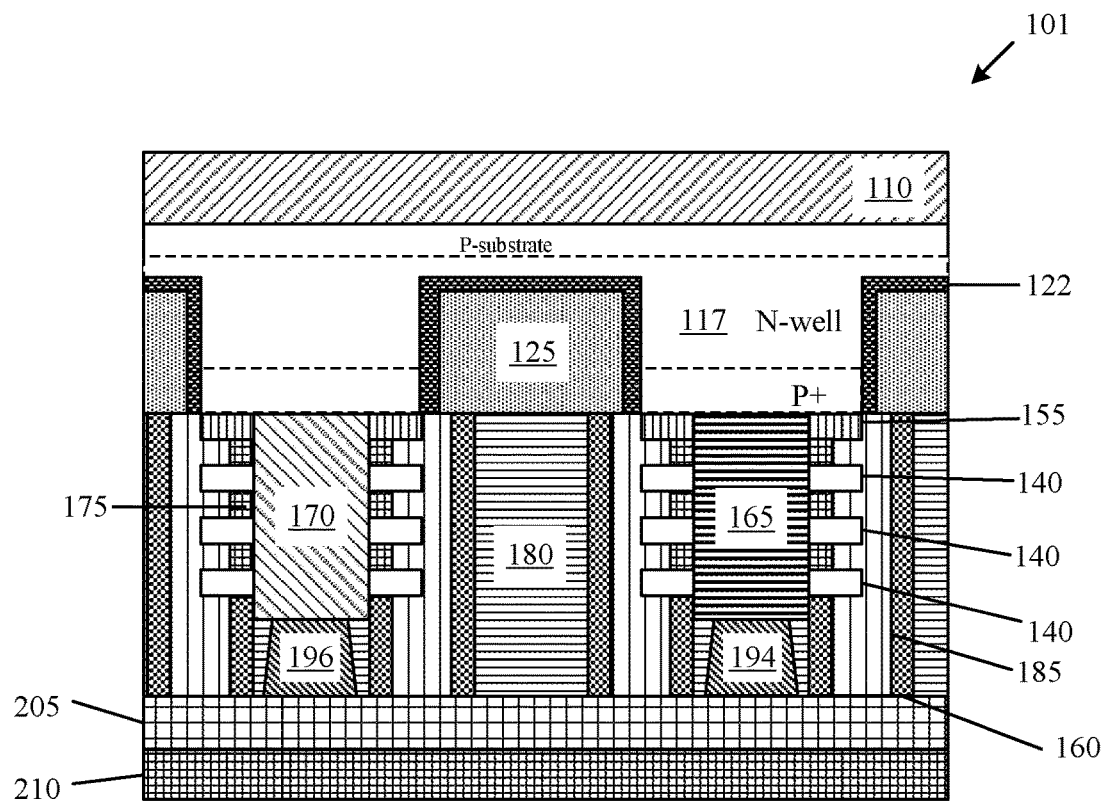
FIG. 21 illustrates a cross section of a second nano device after removal of the lithography layer, in accordance with the embodiment of the present invention.
Figure 22:
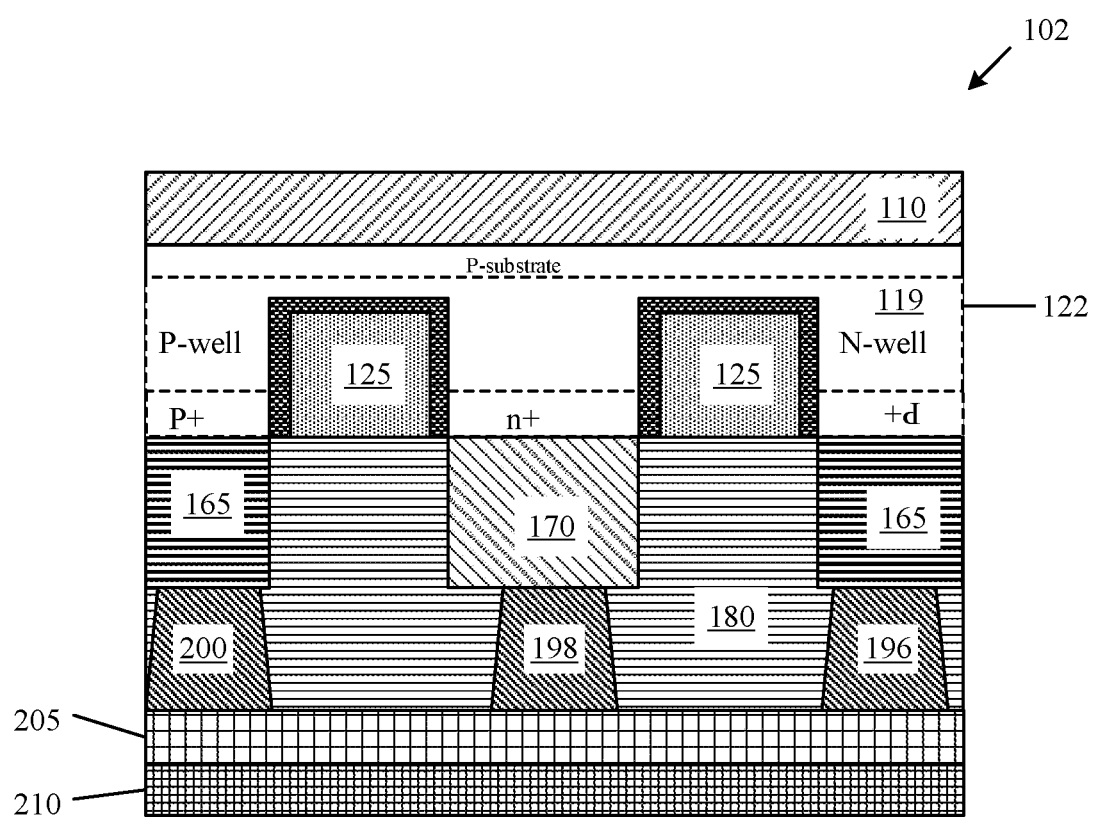
FIG. 22 illustrates a cross section of a third nano device after removal of the lithography layer, in accordance with the embodiment of the present invention.

FIGS. 20, 21, and 22 illustrate a process stage after removal of the lithography layer 215, followed by backside interlayer dielectric 220 deposition and CMP, stopping on the buried oxide layer 110. FIG. 20 illustrates a cross section of a first nano device 100 after formation of a second interlayer dielectric 220, in accordance with the embodiment of the present invention. FIG. 21 illustrates a cross section of a second nano device 101 after removal of the lithography layer, in accordance with the embodiment of the present invention. FIG. 22 illustrates a cross section of a third nano device 102 after removal of the lithography layer, in accordance with the embodiment of the present invention. A backside interlayer dielectric 220 is formed on the exposed surfaces of the liner 122 and the bottom dielectric layer 155. The lithography layer 215 is removed from atop of the buried oxide layer 110.

Figure 23:
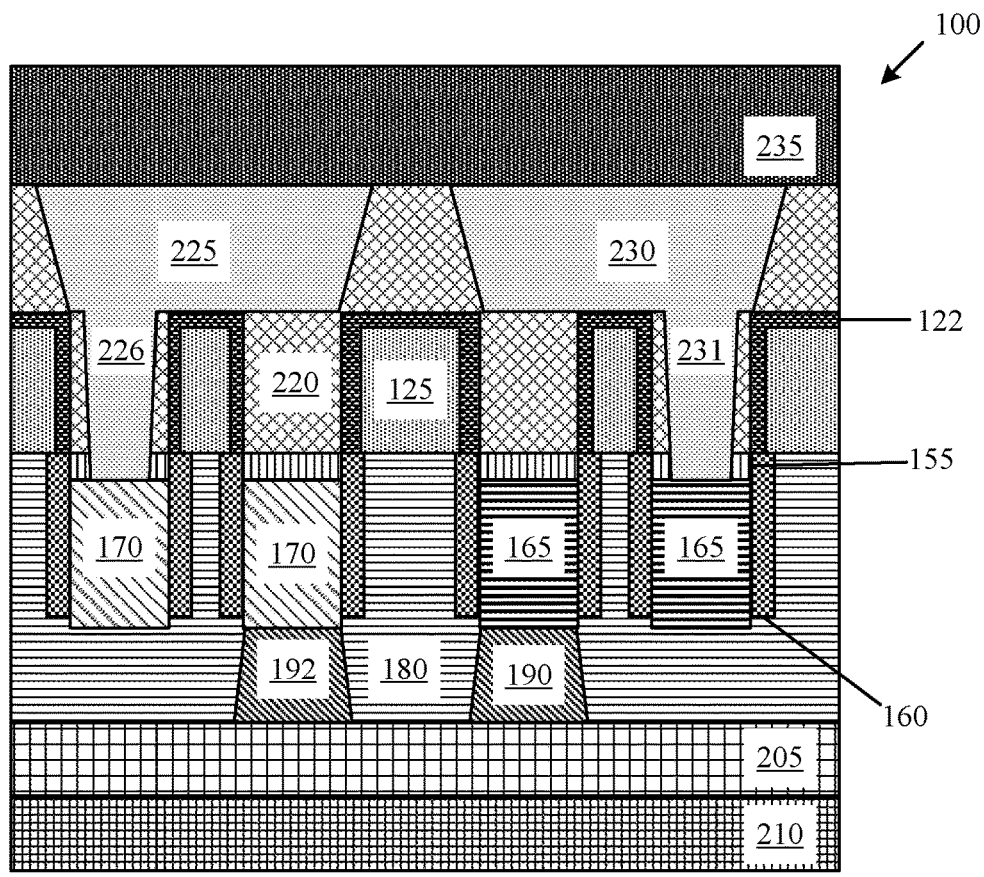
FIG. 23 illustrates a cross section of a first nano device after formation of backside contacts and backside power distribution network in accordance with the embodiment of the present invention.
Figure 24:
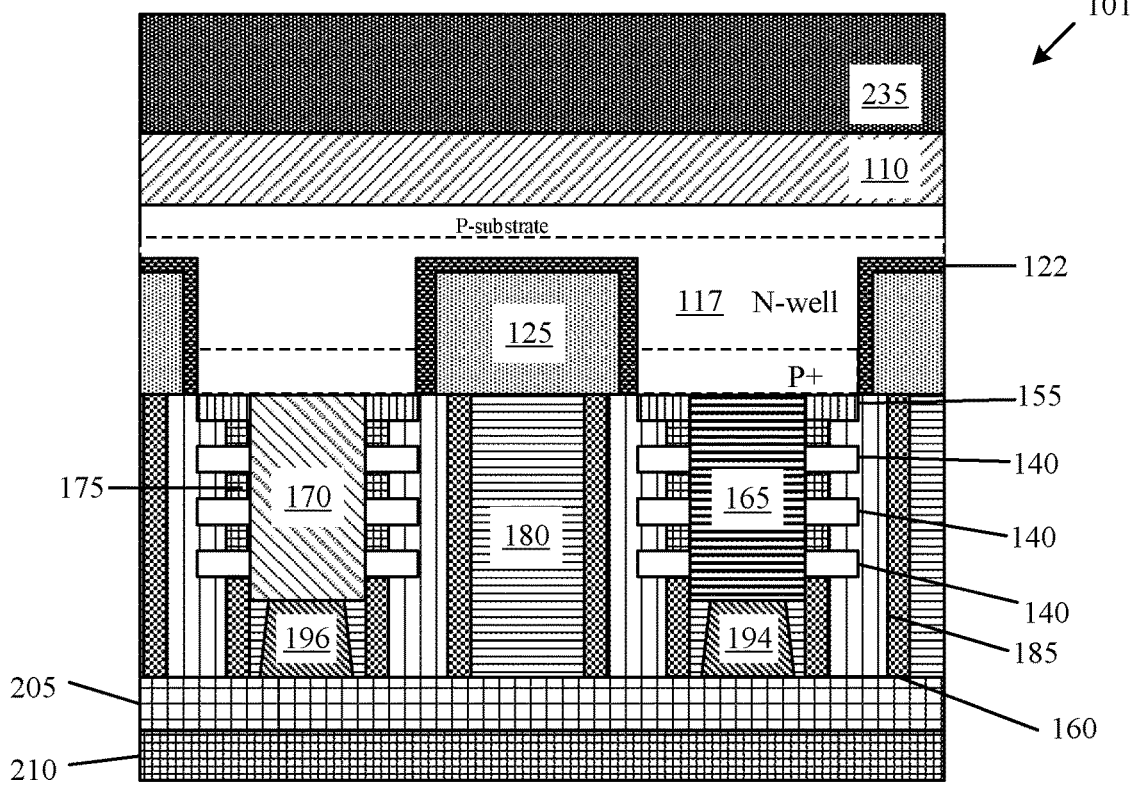
FIG. 24 illustrates a cross section of a second nano device after formation of the backside power distribution network, in accordance with the embodiment of the present invention.
Figure 25:
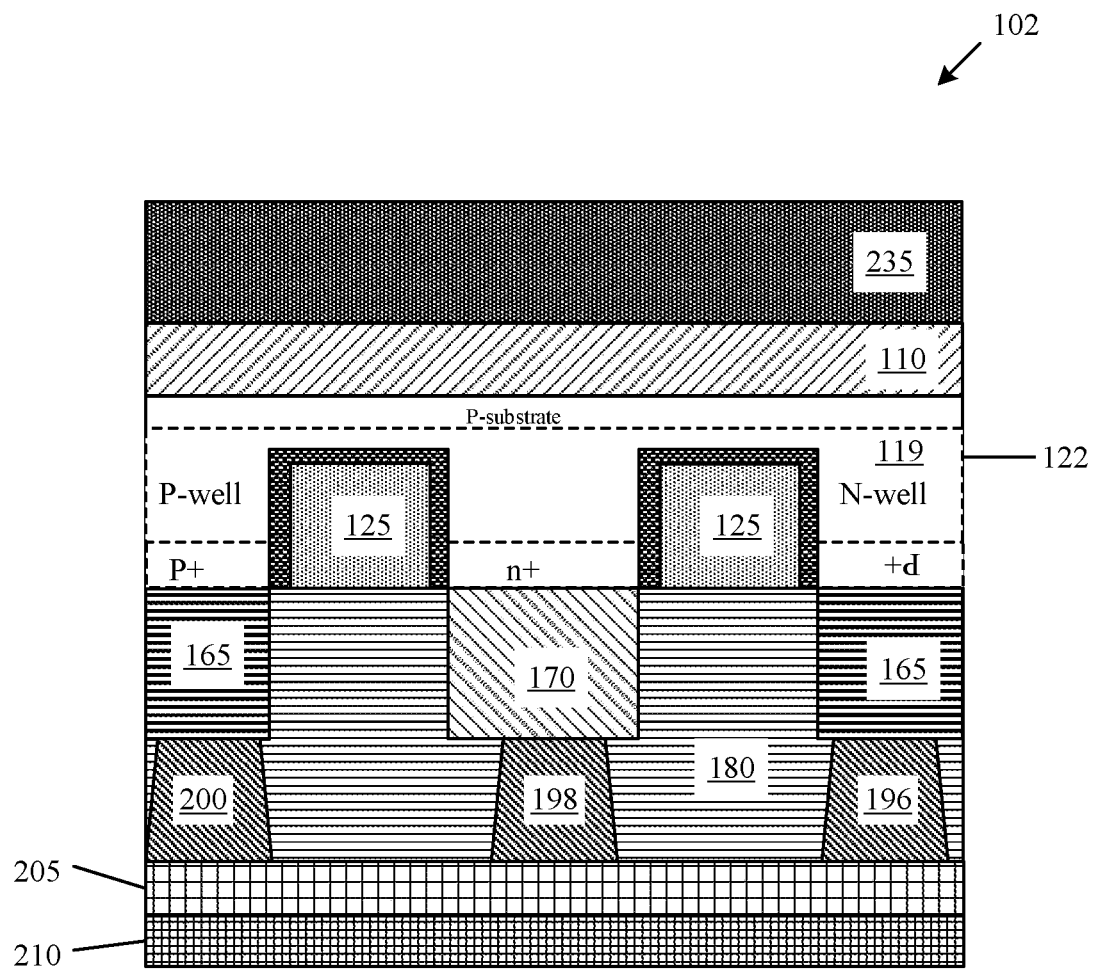
FIG. 25 illustrates a cross section of a third nano device after formation of the backside power distribution network, in accordance with the embodiment of the present invention.

FIGS. 23, 24, and 25 illustrate the process stage after formation of backside source/drain contacts 226, 231, backside power rail 230/225 and backside power distribution network 235. FIG. 23 illustrates a cross section of a first nano device 100 after formation of backside contacts 226, 231, backside power rails 230/225 and backside power distribution network 235 in accordance with the embodiment of the present invention. Trenches are formed in the backside interlayer dielectric 220 and the bottom dielectric layer 155 to expose a backside surface of the source/drains 165, 170. The source/drains 165, 170 that have the backside surface exposed are the source/drains not connected to the first set of contacts 190, 192. The trenches are filled with a conductive metal to form the backside contacts 226, 231 and the backside power rails 225, 230. A backside power distribution network 235 is formed on top of the backside power rails 225, 230 and atop the backside interlayer dielectric 220.

FIG. 24 illustrates a cross section of a second nano device 101 after formation of backside source/drain contacts 226, 231, backside power rail 230/225 and the backside power distribution network 235, in accordance with the embodiment of the present invention. FIG. 25 illustrates a cross section of a third nano device 102 after formation of the backside power distribution network 235, in accordance with the embodiment of the present invention. A backside power distribution network 235 is formed on top of the buried oxide layer 110.

The first nano device 101 is depicted in the present disclosure as a logic device, but that is not necessary. The first nano device 101 is a device that will be located on a dielectric layer, while the second device will be located on the substrate (for example, doped substrate 117, second doped substrate 119, or substrate 105). The dielectric layer, for example, interlayer dielectric 220 is on substantially the same level as the substrate. The substantially the same level means that dielectric layer and the substrate 105 are on the same horizontal plane of the wafer. As illustrated by FIGS. 23, 24, and 25, the backside contacts 226, 231, and backside power rail 225, and 230 are only present in the first nano device 101 forming a connection between the device and the backside power network 235.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
    a first device located on a dielectric layer and a shallow trench isolation layer, wherein the first device is in direct contact with the dielectric layer, wherein the shallow trench isolation layer includes a liner and fill layer, wherein the dielectric layer 1s located adjacent to and in direct contact with two or more surfaces of the shallow trench isolation layer;
    a second device located on a semiconductor substrate layer and the shallow trench isolation layer, wherein the second device is in direct contact with the semiconductor substrate layer, wherein the semiconductor substrate layer 1s located adjacent to and in direct contact with a vertical side surfaces and a horizontal surface of the shallow trench isolation layer, wherein the dielectric layer and the semiconductor substrate layer are located on substantially the same level such that the dielectric layer and the semiconductor substrate layer are located on the same horizontal plane, and
    a backside contact located in the dielectric layer, wherein the backside contact is connected to the first device and not contacted to the second device.

2. The microelectronic structure of claim 1, wherein the first device and the second device are different devices.

3. The microelectronic structure of claim 1, wherein the first device is a logic device.

4. The microelectronic structure of claim 3, wherein the second device is a diode.

5. The microelectronic structure of claim 3, wherein the second device is a bipolar junction transistor.

6. A microelectronic structure comprising:
    a first nano device located on a dielectric layer, wherein the dielectric layer is in contact with the backside of the first nano device;
    a backside contact located in the dielectric layer, wherein the backside contact is connected to the first nano device; and
    a second nano device located on a semiconductor substrate, wherein the semiconductor substrate is in direct contact with the backside of the second nano device, wherein the dielectric layer of the first nano device and the semiconductor substrate of the second nano device are located on substantially the same level such that the dielectric layer and the semiconductor substrate are located on the same horizontal plane, wherein the backside contact is not connected to the second nano device.

7. The microelectronic structure of claim 6, further comprising:
    a backside power network connected to the first nano device through the backside contacts, wherein the backside power network is not connected to the second nano device.

8. The microelectronic structure of claim 7, further comprising:
    a plurality of frontside contacts, wherein the frontside contacts are connected to the first nano device and the second nano device.

9. The microelectronic structure of claim 6, wherein the first nano device is logic device.

10. The microelectronic structure of claim 8, wherein the second nano device is a diode.

11. The microelectronic structure of claim 8, wherein the second nano device is a bipolar junction transistor.

* * * * *